United States Patent [19]
Niehenke et al.

[11] 3,992,675
[45] Nov. 16, 1976

[54] BROADBAND, UPPER SIDEBAND TERMINATED, LOW-NOISE PARAMETRIC AMPLIFIER

[75] Inventors: Edward C. Niehenke, Elkridge; Aldo E. Linsenbardt, Catonsville, both of Md.

[73] Assignee: Westinghouse Electric Corporation, Pittsburgh, Pa.

[22] Filed: Dec. 31, 1975

[21] Appl. No.: 645,727

[52] U.S. Cl. ................................ 330/4.9; 330/4.5
[51] Int. Cl.² ........................................ H03F 7/00
[58] Field of Search ............... 330/4.9, 4.8, 4.5; 307/88.3

[56] References Cited
UNITED STATES PATENTS
3,609,571  9/1971  Klein et al. ..................... 330/4.9

Primary Examiner—R. V. Rollnec
Assistant Examiner—Darwin R. Hostetter
Attorney, Agent, or Firm—H. W. Patterson

[57] ABSTRACT

A parametric amplifier which includes series coupled diodes contained in a resonating wave guide for providing a low noise figure by limiting the impedance to the idler circuit and inhibiting current flow in the upper sideband circuit. The mechanism for inhibiting current flow of the upper sideband circuit is independent of the characteristic impedance of the resonating wave guide to provide a constant, low power requirement, with high gain and broadband performance.

8 Claims, 4 Drawing Figures

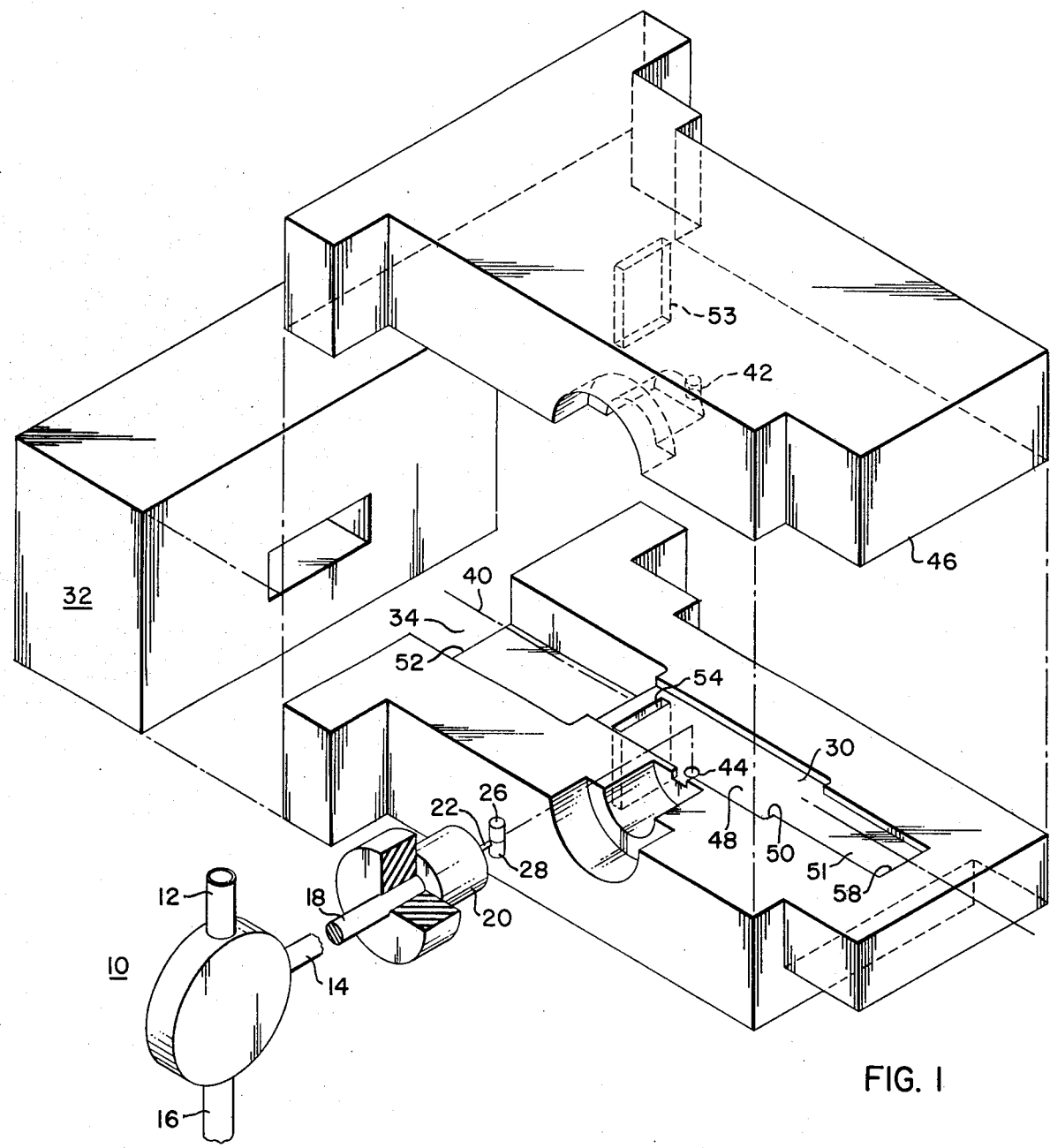
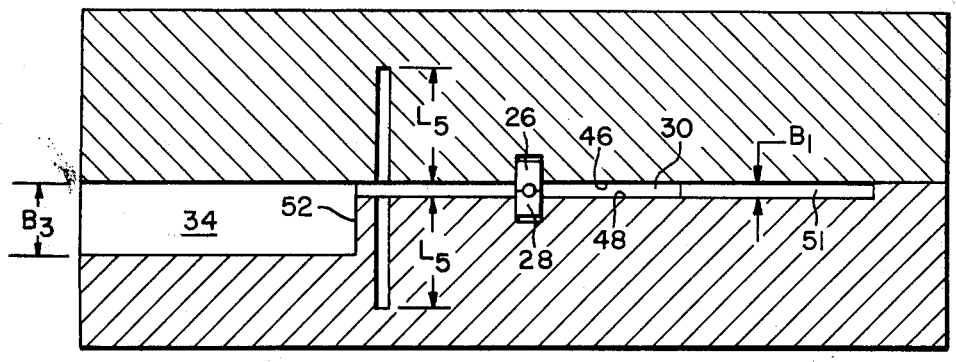
FIG. 1
FIG. 2

BROADBAND, UPPER SIDEBAND TERMINATED, LOW-NOISE PARAMETRIC AMPLIFIER

The invention herein described was made in the course of or under a contract or subcontract thereunder with the Department of the Air Force.

BACKGROUND OF THE INVENTION

1. Field of the Invention

The invention pertains to devices employing the parametric coupling of two signals and, particularly, to broadband parametric amplifiers.

2. Description of the Prior Art

Parametric amplifiers operate on the basis of periodically varying the capacitance of a varactor diode by means of a high-frequency pump signal and transferring energy to a lower frequency input signal by mixing of the input frequency with the pump frequency through an idler frequency. The Manley-Rowe relations show that current must flow at the three frequencies satisfying the relation:

$$f_{pump} = f_{signal} + f_{idler}$$

for gain to exist at the signal frequency. Provisions must therefore be made to present a short circuit or very low impedance to the diode terminals at the idler frequency to allow current to flow at this frequency without introducing excessive losses. In addition, it is desirable that an open circuit appears to the diode terminals to prevent current flow at unwanted frequencies within the parametric amplifier. These frequencies include the second and higher harmonics of the pump, signal and idler frequencies and the upper sideband frequency which is the sum of the pump and input signal frequencies.

In the prior art, devices employing the parametric coupling of two signals to achieve a desired result have typically been suitable only for narrowband applications. Although some broadband devices have been developed, these devices made no attempt to limit the upper sideband signal which is complementary to the useful idler signal, and were therefore, noisy devices which were unsuitable for many applications. Devices which have attempted to limit noise by controlling the current at the upper sideband frequency, such as described in U.S. Pat. No. 3,609,571 of G. I. Klein and R. L. Zahm, have utilized tuning mechanisms, which when properly adjusted, substantially eliminated the upper sideband frequency. However, as these devices are tuned to eliminate the upper sideband frequency, the impedance at the pump signal is also affected which causes these devices to become less efficient requiring high pump power.

The present invention satisfies the need for high gain parametric devices which provide a low noise figure by inhibiting the current at the upper sideband frequency independently of the impedance established at the pump frequency so that the device's broadband performance and low power requirement are not compromised.

SUMMARY OF THE INVENTION

The invention provides an efficient, broadband parametric amplifier in which the noise figure is controlled by suppressing the upper sideband signal which is generated with the useful idler signal. The non-linear reactance, which may be comprised of series-connected varactor diodes, provides the parametric coupling between the pump and input signals. This reactance is contained in a resonating wave guide so that the input impedance to the diodes at the input signal is controlled by an impedance transformer and input impedance at the pump signal is controlled by the transverse and longitudinal location of the diode within the resonating wave guide. An open circuit condition at the non-linear reactance is provided at the pump frequency by its longitudinal relation to a shorting wall. The transverse location of the non-linear reactance is selected at a maximum from the longitudinal axis of the resonating wave guide to improve the noise figure by reducing the effective diode circuit inductance at the idler frequency and thereby permitting a higher idler frequency. The impedance of the non-linear reactance at the pump frequency is then matched to the impedance of a propagating wave guide to which the resonating wave guide is transformer coupled by providing an appropriate distance between the non-linear reactance and the propagating wave guide. The upper sideband signal is attenuated at upper and lower choke wave guides so that it does not propagate from the non-linear reactance into the propagating wave guide. In addition, the upper and lower choke wave guides are above the cut-off frequency of the pump signal so that the attenuation of the upper sideband signal in this direction is accomplished substantially independently of the impedance presented to the pump signal. Also, the upper and lower choke waveguides are located substantially one-half a wavelength at the upper sideband frequency from the longitudinal coordinate of the non-linear reactance so that the upper and lower choke wave guides present a maximum reactance to the upper sideband signal at the location of the non-linear reactance. A terminating wave guide is also provided on the side of the non-linear reactance which is opposite the upper and lower choke wave guides to provide a short circuit condition to the upper sideband frequency at a distance along the longitudinal axis of the resonating wave guide which is substantially an odd multiple of one-fourth the wavelength at the upper sideband frequency. Therefore, the terminating wave guide presents a reactance to the non-linear reactance which is the conjugate of the reactance presented by the upper and lower choke wave guide thereby inhibiting current in the resonating wave guide at the upper sideband frequency. The cut-off frequency of the termination wave guide is also above the pump frequency so that the suppression of the upper sideband frequency is done substantially independently of the impedance of the resonating wave guide to the pump signal.

BRIEF DESCRIPTION OF THE DRAWINGS

FIG. 1 is an exploded isometric view of a parametric amplifier which is the preferred embodiment of the present invention in which the parametric amplifier is coupled to a circulator and a pump.

FIG. 2 shows a side view of the parametric amplifier of FIG. 1.

DESCRIPTION OF THE PREFERRED EMBODIMENT

Figure 3:
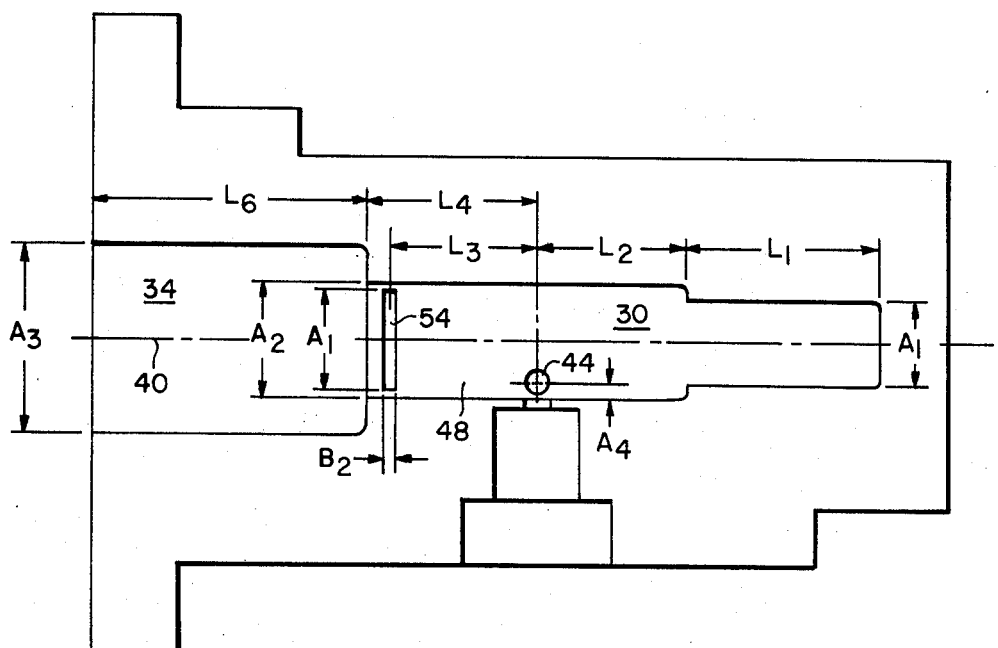
FIG. 3 shows a plan elevation of the parametric amplifier of FIG. 1.

In FIG. 1, a circulator 10 having a signal input port 12, a signal amplifier port 14, and a signal output port 16 is provided with an input signal through signal input port 12 which passes out of amplifier port 14 and is amplified according to the present invention. The amplified signals are returned to circulator 10 through amplifier port 14 and appear as output signals at signal output port 16. The input signal passes out of circulator 10 at signal amplifier port 14 and to a conductor which, for example, could be comprised of coaxial conductor 18 although a strip line or micro-strip line conductor could alternatively be used. Coaxial conductor 18 is connected to impedance transformer 20 which provides an impedance which substantially matches the impedance of said input signal circuit to control the gain in the input signal. The center conductor 22 of impedance transformer 20 is connected to the cathodes of a parallel combination of balanced varactor diodes 26 and 28 whose anode terminals are connected to ground potential.

As well understood by those skilled in the art and as demonstrated by the Manley-Rowe equations, when a signal is applied to varactor diodes 26 and 28 having a frequency which may be denominated the pump frequency, the non-linear capacitance characteristics of varactor diodes 26 and 28 generate a third signal which has a frequency substantially equal to the pump frequency minus the frequency of the input signal and a fourth signal which has a frequency substantially equal to the pump frequency plus the frequency of the input signal. These may be designated as the idler frequency and upper sideband frequency respectively. The amplification of the input signal is realized due the fact that the current flowing at the idler frequency in varactor diodes 26 and 28 causes the current at the signal frequency to be 180° out of phase with respect to the input voltage of input signal. Therefore, if the effective reactance of the varactor diodes 26 and 28 is minimized, the input signal on center conductor 22 sees varactor diodes 26 and 28 as effective negative resistance which causes the amplification of the input signal.

As well known in the art, the connection arrangement of center conductor 22 with diodes 26 and 28 establishes a virtual ground connection at center conductor 22 thereby isolating the idler, pump and upper sideband frequencies from the center conductor 22.

Varactor diodes 26 and 28 are contained in resonating wave guide 30 having a longitudinal dimension $L_2 + L_4$ and transverse dimensions $A_2$ by $B_1$ and are resonated at the pump signal by signals provided by pump 32 through propagating wave guide 34 having a longitudinal dimension $L_6$ and transverse dimensions $A_3$ by $B_3$. The characteristic impedance of propagating wave guide 34 is substantially matched to the characteristic impedance of pump 32 to provide low insertion loss between pump 32 and propagating wave guide 34. To maintain low insertion loss however, and provide amplification with relatively low pump power, the impedance of diodes 26 and 28 at the pump frequency must be matched to wave guide impedance 34 throught the transforming action of wave guide 30. This impedance matching at the pump frequency is accomplished by the transverse and longitudinal position of varactor diodes 26 and 28 within resonating wave guide 30. It can be demonstrated that the noise figure of the described parametric amplifier can be described by the following relation:

$$F = 1 + \frac{T_d}{T_o} \times \frac{1 + \frac{(m_i\omega_c)^2}{\omega_i^2} \cdot \frac{R_s(R_s+R_i)}{|(Z_i)|^2} + \frac{(m_i\omega_c)^2}{\omega_u} \cdot \frac{R_s(R_s+R_u)}{|Z_u|^2}}{-1 + \frac{(m_i\omega_c)^2}{\omega_s\omega_i} \cdot \frac{R_s(R_s+R_i)}{|(Z_i)|^2} - \frac{(m_i\omega_c)^2}{\omega_s\omega_i} \cdot \frac{R_s(R_s+R_u)}{|Z_u|^2}} \quad (1)$$

where:
 $F =$ the noise figure
 $T_d =$ varactor diode temperature in Degrees Kelvin
 $T_o = 290°$ Kelvin
 $m_i\,\omega_c =$ varactor pumped angular cutoff frequency
 $R_s =$ series resistance of varactor diode
 $R_i =$ series resistance of external idle circuitry
 $R_u =$ series resistance of external upper sideband circuitry 0.
 $_i =$ idle angular frequency
 $_u =$ upper sideband angular frequency
 $_s =$ signal angular frequency
 $Z_i =$ idler impedance
 $Z_u =$ upper sideband impedance From Equation (1) it can be seen that the noise figure of the parametric amplifier can be improved where the idler frequency is made as high as possible using high quality varactor diodes. Such a higher idler frequency could be attained if the effective diode circuit inductance of varactor diodes 26 and 28 could be reduced. This is accomplished by moving the transverse location of varactor diodes in resonating wave guide 30 to an extreme transverse position away from the center longitudinal axis 40 of resonating wave guide 30.

It is also known to those skilled in the art that a wave guide such as resonating wave guide 30 has an impedance transforming function described by the relation:

$$\text{Sin}^{-2}(\pi A_4/A_2) \quad (2)$$

where:
 $A_2$ is the length of the largest transverse dimension of wave guide 30, and
 $A_4$ is the distance of the center of the varactor diodes 26 and 28 from an extremity of $A_2$.

With the internal impedance of varactor diodes 26 and 28 now established, the maximum effect of the pump signal may be provided to varactor diodes 26 and 28 by locating the varactor diodes 26 and 28 within diode wells 42 and 44 in top plane 46 and bottom plane 48, respectively, which are at distance $L_2$ slightly less than one-quarter wavelength at the pump frequency from shorting end 50 of resonating wave guide 30. This provides an effective open circuit condition at the pump frequency at the longitudinal location of the varactor diodes 26 and 28. A distance of slightly less than one quarter wavelength at the pump frequency is used to compensate for the inductance of terminating wave guide 51 whose function is described later. Finally, the transformed impedance of diodes 26 and 28 is matched to the characteristic impedance of propagating wave guide 34 by $L_4$, the longitudinal position of diode wells 42 and 44 with respect to wave guide transition 52. The approximate value of $L_4$ has been calculated to be approximately four-tenths of a wavelength at the pump frequency. Of course, the precise length of $L_4$ is dependent upon the internal impedance of varactor diodes 26 and 28 and the transformation ratio of wave guide transition 52 as well as the magnitude of the characteristic impedance of propagating wave guide 34. Since these factors are, themselves, subject to some degree of variation, the precise value of $L_4$ must be empirically determined.

From equation (3), it can be seen that the resistance to the input signal, and therefore amplification of the input signal, is directly dependent upon the magnitude of current flowing at the idler frequency and upper sideband frequency.

$$R = R_s + \frac{S_1 S_1^*}{\omega_s} - \frac{1/\omega_i [R_s+R_i]}{[R_s+R_i]^2 + X_i^2} + \frac{1/\omega_u [R_s+R_u]}{[R_s+R_u]^2 + X_u^2} \quad (3)$$

where:
- $R$ = the resistance to the input signal
- $R_s$ = series resistance of varactor diode
- $R_i$ = series resistance of external idle circuitry
- $R_u$ = series resistance of external upper sideband circuitry
- $\omega_i$ = idle angular frequency
- $\omega_u$ = upper sideband angular frequency
- $\omega_s$ = signal angular frequency
- $X_i$ = series reactance of idler frequency circuit
- $X_u$ = series reactance of upper sideband frequency circuitry
- $S_1$ = fundamental elastance coefficient of pumped elastance; and
- $S_1^*$ = the conjugate of the fundamental elastance coefficient of pumped elastance Several important facts can be ascertained from Equation (3). First, the lower the impedance to the idler circuit, the higher the amplification; and second, the higher the impedance to the upper sideband frequency, the higher the amplification. From equation (1) it can be seen that the previous conditions also result in minimum noise Figure. In order to obtain a broadband idle circuit which will have no resistive loading due to the pump 32, the $A_2$ transverse dimension of resonating wave guide 30 is such that the cut-off frequency of resonating wave guide 30 falls between the idler frequency and the pump frequency so that resonating wave guide 30 will not sustain a signal at the idler frequency and that frequency is confined to varactor diodes 26 and 28.

Upper choke wave guide 53 and lower choke wave guide 54 have substantially equal longitudinal dimensions $L_5$ and substantially equal transverse dimension $A_1$ by $B_2$ to provide rectangular apertures in top plane 46 and bottom plane 48 respectively whose center is along the longitudinal center axis 40 of resonating wave guide 30. The $L_5$ longitudinal dimension of upper choke wave guide 53 and lower choke wave guide 54 is substantially equal to one-quarter of a wave length at the upper sideband frequency provide an open circuit condition at the rectangular apertures formed in top plane 46 and bottom plane 48. These open circuit conditions prevent the propagation of the upper sideband signal from the varactor diodes 26 and 28 into propagating wave guide 34. Alternatively, only one choke wave guide either upper choke wave guide 53 or lower choke wave guide 54, could have been used to attenuate upper sideband signals propagating from varactor diodes 26 and 28 to propagating wave guide 34 although such a single choke wave guide arrangement would not be as effective as the double choke arrangement of FIG. 1. Similarly, for either the double or single choke arrangement, the choke could be moved to an extreme transverse position along $A_2$ on either side of the center longitudinal axis 40 of resonating wave guide 30, or at any position short of that extreme position, again at the cost of some effectiveness in attenuation.

In addition, upper choke wave guide 53 and lower choke wave guide 54 present a predetermined reactance at the longitudinal location of varactor diodes 26 and 28 in resonating wave guide 30. Theoretically, upper and lower choke wave guides 53 and 54 could be located at any longitudinal position of resonating wave guide 30 within the distance of $L_4$, except at values close to odd multiples of one quarter of a wavelength at the upper sideband frequency. However, the preferred embodiment shows a distance of $L_3$ from the varactor diode longitudinal position where $L_3$ is one-half a wavelength at the upper sideband frequency thereby presenting an effective open circuit condition to the varactor diodes 26 and 28 at the upper sideband frequency.

Terminating wave guide 51 has transverse dimensions of $A_1$ by $B_1$ and a longitudinal dimension of $L_1$ so that the shorting wall 58 of terminating wave guide 51 is at a predetermined longitudinal position in relation to varactor diodes 26 and 28 which may be described as follows. Since upper and lower choke wave guides 53 and 54 present a reactance to the varactor diode at their longitudinal position, and since maximum gain will be achieved if there is minimum current flow at the upper sideband frequency, the $L_1$ dimension of terminating wave guide 51 is selected such that shorting wall 58 is at a distance from the longitudinal position of varactor diodes 26 and 28 so that it affords substantially the conjugate reactance which is provided to the longitudinal position of varactor diodes 26 and 28 by upper and lower choke wave guides 53 and 54. This value would be exactly the conjugate if the varactor diode consisted only of an R, L, C series circuit. However, due to the shunting case capacitance across the diode, $L_1$ is adjusted to compensate for this capacitance as well so that no current flows at the upper sideband frequency. In the example of the preferred embodiment, a distance of one-half the wavelength at the upper sideband signal was selected for $L_3$. $L_1 + L_2$, the longitudinal position of shorting wall 58, is also set to present an open circuit to the varactor diodes at the upper sideband frequency. This position may be approximated by the following condition that $L_1 + L_2$ must be substantially an odd multiple of one-quarter wavelengths at the upper sideband frequency so that the effect of shorting wall 58 is also to present an open circuit condition to varactor diodes 26 and 28 at their longitudinal position. If a different longitudinal position of upper and lower choke wave guides 53 and 54 had been selected, the current flow at the upper sideband frequency could be minimized by selecting the length $L_1$ such that shorting wall 58 presented substantially a conjugate impedance of the same magnitude at the longitudinal position of varactor diodes 26 and 28 as the impedance of choke wave guides 53 and 54. For example, if the reactance presented by choke wave guides 53 and 54 were inductive, the reactance presented by shorting wall 58 would be of the same magnitude but capacitive in nature accounting also for the case capacitance of the diodes.

It should be noted that choke wave guides 53 and 54 and termination wave guide 51 all have the same transverse dimension $A_1$. Therefore, wave guides 53, 54 and 51 will all have the same cut-off frequency. These cut-off frequencies are selected such that they fall between the pump signal frequency and the upper sideband signal frequency so that while wave guides 53, 54 and 51 prevent the propagation of the upper sideband signal into propagating wave guide 34 and also prevent the current flow in resonating wave guide 30 at the upper sideband frequency, they are cut off from the pump wave guide frequency and therefore variations in the $L_1$ and $L_5$ dimensions of wave guides 51, 54 and 53 do not materially affect the input impedance to the pump signal. Therefore, a low-noise, high gain amplifier is provided whose impedance at the pump signal frequency is substantially matched to the impedance of the pump 32 independently of the wave guides 51, 54 and 53 which inhibit the flow of current at the upper sideband frequency to provide an amplifier which operates at a constant, relatively low pump power. Moreover, since the circuits for the idler signal and for the upper sideband signal are of relatively small physical dimensions when compared with amplifiers of the prior art, the described amplifier is not as subject to changes in the frequencies of the input idler, upper sideband and pump signals and is therefore of relatively broadband application for constant, relatively low pump power requirement.

A S-band parametric amplifier such as is disclosed in the preferred embodiment has been fabricated and tested. Using a pump frequency of 23.5 Gigahertz, noise figures of 1.1 dB, including a circulator loss of 0.35 dB, have consistently been realized for this amplifier, paralleling the noise figure which should theoretically be achieved. The wideband characteristic has been demonstrated in that, for a 3 dB single tuned bandwidth of 120 Megahertz at 18 dB gain, the bandpass has been tuned over 500 Megahertz with bias voltage and pump power variation with substantially constant noise figure. A pump match of 1.5 to 1 with only 20 milliwatts of pump power drive was required. The absence of tuners permits low cost, high volume production techniques.

Figure 4:
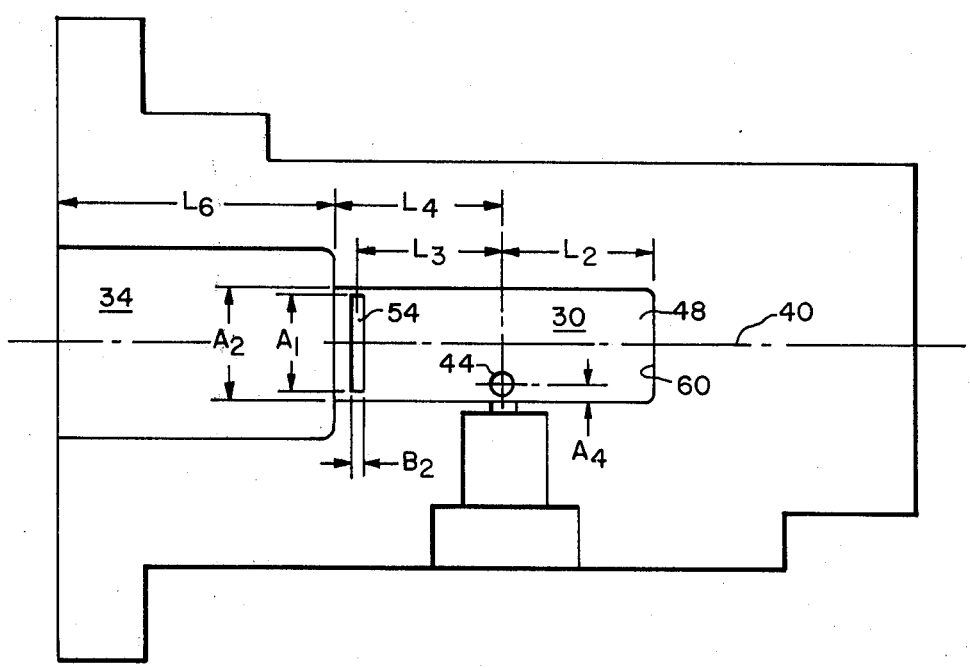
FIG. 4 shows a plan view of a parametric amplifier which is a modification of the parametric amplifier of FIG. 1.

An alternative to the preferred embodiment of the present invention may be seen in FIG. 4. The parametric amplifier of FIG. 4 is substantially identical to the amplifier of FIG. 1 except that terminating wave guide 51 of the amplifier of FIG. 1 has been omitted in the amplifier of FIG. 4. The amplifier of FIG. 4 provides low noise, broadband performance with low pump power provided the length $L_2$ of resonating wave guide 30 is not close to a half wavelength at the upper sideband frequency. This would short the upper sideband frequency circuit under which condition wave guides 53 and 54 could not provide a conjugate reactance at the upper sideband frequency. Upper and lower choke wave guides 53 and 54 may be moved toward the longitudinal position of diodes 26 and 28 to shorten the distance $L_3$ to the extent necessary to balance the reactance provided by end wall 60 of resonating wave guide 30 at the upper sideband frequency and the case capacitance of the diodes by providing the conjugate reactance at the upper sideband frequency. It is estimated that the parametric amplifier of FIG. 4 provides acceptable performance when the distance $L_2$ is less than 0.4 of a wavelength at the upper sideband frequency.

We claim:

1. Apparatus for the parametric coupling of an input signal with a pump signal which results in an idler signal and an upper sideband signal, said apparatus comprising:
   first means for propagating said pump signal;
   second means for reactively coupling said pump signal of said propagating means to said input signal;
   third means for providing a first reactance to said upper sideband signal to prevent said upper sideband signal from entering said propagating meanss; and
   fourth means for providing a second reactance to said upper sideband signal which is the conjugate of said first reactance and which cooperates with said first reactance to prevent current from flowing at the frequency of said upper sideband signal.

2. Apparatus for the parametric coupling of an input signal with a pump signal which results in an idler signal and an upper sideband signal, said apparatus comprising:
   first means for propagating said pump signal;
   second means for reactively coupling said pump signal propagated by said first means to said input signal;
   third means for providing an open circuit to said upper sideband signal to prevent said upper sideband signal from entering said propagating means; and
   fourth means for providing a short circuit to said upper sideband signal to inhibit current from flowing at the frequency of said upper sideband signal.

3. A broadband parametric amplifier providing for the low noise and high gain amplification of an input signal by the efficient parametric coupling of said input signal with a pump signal which results in an idler signal and an upper sideband signal, said apparatus comprising:
   first means for propagating said pump signal;
   second means for reactively coupling said pump signal propagated by said first means to said input signal;
   third means for providing a first reactance to said upper sideband signal to prevent said upper sideband signal from entering said propagating means; and
   fourth means for providing a second reactance to said upper sideband signal which is the conjugate of said first reactance and which cooperates with said first reactance to inhibit current from flowing at the frequency of said upper sideband signal.

4. A broadband parametric amplifier for the low noise and high gain amplification of an input signal by efficient parametric coupling of said input signal with a pump signal to provide an idler signal and a consequent upper sideband signal, said apparatus comprising:
   first means for providing an idler signal which appears as a negative impedance to said input signal;
   second means for resonating said first means in response to said pump signal;
   third means for providing an open circuit to said upper sideband frequency to confine said upper sideband signal to said second means; and
   fourth means for providing a short circuit to said upper sideband frequency to prevent current from flowing within said second means at said upper sideband frequency.

5. A broadband parametric amplifier having a high gain and a low noise figure for the amplification of an input signal by the efficient parametric coupling of a signal produced by a pump to provide a negative impedance to said input signal, said amplifier comprising:

first means for generating an idler signal and an upper sideband signal in response to said pump signal;

second means for resonating said first means at said pump signal frequency where the impedance of said first means at the frequency of said pump signal is transformed to substantially match the impedance of said pump to afford a low insertion loss to said pump signal;

third means for providing an open circuit to said upper sideband frequency to confine said upper sideband signal to said second means where said transformed impedance of said first means is substantially independent of said third means; and fourth means for providing a short circuit at said upper sideband frequency to prevent current flow within said second means at said upper sideband frequency.

6. A broadband parametric amplifier having a high gain and a low noise figure for the amplification of an input signal by the efficient parametric coupling of a signal produced by a pump to provide a negative impedance to said input signal, said amplifier comprising:

means for generating an idler signal and an upper sideband signal in response to said pump signal;

means for propagating said pump signal where the impedance of said propagating means is substantially matched to the impedance of said pump;

means for resonating said generating means in response to said pump signal of said propagating means where the impedance of said generating means at the frequency of said pump signal is transformed to substantially match the impedance of said propagating means, and where said resonating means affords a substantially open circuit to said pump signal at said generating means;

choke means for preventing the upper sideband signal from propagating from said generating means into said propagating means by providing a substantially open circuit condition for said upper sideband signal between said generating means and said propagating means, where said open circuit condition is substantially independent of the impedance of said resonating means at the frequency of said pump signal; and terminating means for shorting the upper sideband signal of said generating means to substantially inhibit current flow in said resonating means at said upper sideband frequency by opposing the reactance of said choke means with a conjugate reactance at the location of said generating means.

7. A broadband parametric amplifier having a high gain and a low noise figure for the amplification of an input signal by providing a negative impedance to said input signal through an idler signal produced in response to a pump signal provided by a pump, said amplifier comprising:

means for generating said idler signal and an upper sideband signal in response to said pump signal;

means for propagating said pump signal where the impedance of said propagating means is substantially matched to the impedance of said pump;

means for resonating said generating means in response to said pump signal of said propagating means where the impedance of said generating means at the frequency of said pump signal is transformed to substantially match the impedance of said propagating means, confines said idler signal to said generating means, and affords a substantially open circuit to said pump signal at the location of said generating means;

a choke wave guide fixed to said resonating means between said generating means and said propagating means for blocking the upper sideband signal from propagating from said generating means into said propagating means by providing a substantially open circuit condition for said upper sideband signal between said generating means and said propagating means, where said open circuit condition is substantially independent of the impedance of said resonating means at the pump frequency; and a terminating wave guide fixed to said resonating means for shorting the upper sideband signal of said generating means on the opposite side of said generating means as said choke wave guide to substantially inhibit current flow in said resonating means at said upper sideband frequency by opposing the reactance of said choke wave guide with a conjugate reactance at the location of said generating means.

8. A broadband parametric amplifier having a high gain and a low noise figure for the amplification of an input signal by providing a negative impedance to said input signal through an idler signal produced in response to a pump signal provided by a pump, said amplifier comprising:

means for generating said idler signal and an upper sideband signal in response to said pump signal;

means for substantially matching the impedance of said input signal with the impedance of said generating means;

means for propagating said pump signal where the impedance of said propagating means is substantially matched to the impedance of said pump;

means for transforming the impedance of said generating means from a first predetermined value to a second predetermined value;

means for resonating said generating means in response to said pump signal of said propagating means where said resonating means confines said idler signal to said generating means to decrease said noise figure of said parametric amplifier by limiting the impedance to the current of said generating means at the frequency of the idler signal, and where the transformed impedance of said generating means at the frequency of said pump signal substantially matches the impedance of said propagating means to reduce the insertion loss of said pump signal thereby improving the efficiency of said parametric amplifier, and where said resonating means affords a substantially open circuit to said pump signal at the location of said generating means which also improves the efficiency of said parametric amplifier;

a choke wave guide fixed to said resonating means between said generating means and said propagating means and forming a rectangular aperture in at least one wall of said resonating means, the center longitudinal axis of said choke wave guide intersecting the longitudinal axis of said resonating means at a point which is substantially an integral multiple of one-half wavelengths at the frequency of said upper sideband signal from the intersection of said longitudinal axis of said resonating means with a perpendicular line drawn from the center of said generating means, where the cut-off frequency of said choke wave guide is below the frequency of said upper sideband signal for blocking the upper sideband signal from propagating from said generating means into said propagating means by providing a substantially open circuit condition for said upper sideband signal, and where the cut-off frequency of said choke wave guide is above the frequency of said pump signal so that said impedance of said resonating means to said pump signal is substantially independent of said open circuit condition established by said choke wave guide; and a terminating wave guide fixed to said resonating means and forming a rectangular aperture in at least one wall of said resonating means, the center of said aperture coinciding with the longitudinal axis of said resonating means, said terminating wave guide having a shorting wall which is intersected by an extension of the longitudinal axis of said resonating means at a point along such extension which is substantially an odd integral multiple of one-fourth wavelengths at the frequency of said upper sideband signal from said intersection of said longitudinal axis of said resonating means and a perpendicular line drawn from the center of said generating means, where the cut-off frequency of said terminating wave guide is below the frequency of said upper sideband signal for shorting the upper sideband signal of said generating means on the opposite side of said generating means as said choke wave guide to substantially inhibit current flow in said resonating means at said upper sideband frequency by opposing the reactance of said choke wave guide with a conjugate reactance at the location of said generating means, and where the cut-off frequency of said terminating wave guide is above the frequency of said pump signal so that said impedance of said resonating means to said pump signal is substantially independent of said short circuit condition established by said terminating wave guide.

* * * * *